United States Patent
Wu et al.

(10) Patent No.: US 10,498,241 B2
(45) Date of Patent: Dec. 3, 2019

(54) LOAD TRANSIENT DETECTION METHOD USED IN MULTI-PHASE CONVERTERS

(71) Applicant: Chengdu Monolithic Power Systems Co., Ltd., Chengdu (CN)

(72) Inventors: Xiaokang Wu, Hangzhou (CN); Lijie Jiang, Hangzhou (CN); Binci Xu, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/228,131

(22) Filed: Dec. 20, 2018

(65) Prior Publication Data

US 2019/0207518 A1 Jul. 4, 2019

(51) Int. Cl.
| | |
|---|---|
| H02M 3/158 | (2006.01) |
| H02M 1/00 | (2006.01) |
| H02M 1/08 | (2006.01) |
| G01R 29/027 | (2006.01) |
| G01R 29/033 | (2006.01) |
| H02M 3/156 | (2006.01) |

(52) U.S. Cl.
CPC ...... *H02M 3/1584* (2013.01); *G01R 29/0273* (2013.01); *G01R 29/033* (2013.01); *H02M 1/08* (2013.01); *H02M 2001/0009* (2013.01); *H02M 2003/1566* (2013.01); *H02M 2003/1586* (2013.01)

(58) Field of Classification Search
CPC ............... H02M 3/1584; H02M 3/158; H02M 2003/1586; H02M 2001/0009; H02M 2003/1566
See application file for complete search history.

(56) References Cited

U.S. PATENT DOCUMENTS

| | | | | |
|---|---|---|---|---|
| 10,243,465 | B1* | 3/2019 | Young | ...................... H02M 1/08 |
| 2013/0307498 | A1* | 11/2013 | Jiang | ........................ G05F 1/10 |
| | | | | 323/271 |
| 2013/0307503 | A1* | 11/2013 | Ouyang | ..................... G05F 1/10 |
| | | | | 323/282 |
| 2014/0160601 | A1* | 6/2014 | Ouyang | ................ H02M 3/158 |
| | | | | 361/18 |
| 2015/0270773 | A1* | 9/2015 | Jiang | ....................... H02M 1/32 |
| | | | | 323/234 |

* cited by examiner

*Primary Examiner* — Yusef A Ahmed
*Assistant Examiner* — Sisay G Tiku
(74) *Attorney, Agent, or Firm* — Perkins Coie LLP

(57) ABSTRACT

A control method of multi-phase converters, wherein the multi-phase converter includes a plurality of switching circuits coupled in parallel between an input voltage and a load. The control method includes: comparing a feedback signal with a reference signal to generate a comparison signal, wherein the feedback signal is indicative of an output voltage provided to the load; determining the number of switching circuits for power operation based on the load current; detecting a period of the comparison signal; comparing the detected period of the comparison signal with a time threshold to determine whether a transient rise of load current has occurred; and getting all the switching circuits into power operation if a transient rise of load current is detected.

15 Claims, 6 Drawing Sheets

LOAD TRANSIENT DETECTION METHOD USED IN MULTI-PHASE CONVERTERS

CROSS-REFERENCE TO RELATED APPLICATIONS

This application claims the benefit of CN application 201711469662.3, filed on Dec. 29, 2017, and incorporated herein by reference.

TECHNICAL FIELD

The present invention generally relates to electronic circuits, and more particularly but not exclusively, to multi-phase switching converters.

BACKGROUND

In order to optimize the efficiency of multi-phase converters, auto-phase shedding (also known as phase-cut) is usually required. In phase-cut mode, the number of switching circuits under power operation is determined by the magnitude of load current. When the load current is small, only part of the switching circuits in the multi-phase converter work and transfer energy to the load. However, if the load current rises instantaneously at this time, due to the time delay caused by ripple filtering in load current sensing, the multi-phase converter will not be able to respond in time, resulting in a large undershoot at the output voltage.

SUMMARY

Embodiments of the present invention are directed to a control method of multi-phase converters, wherein the multi-phase converter includes a plurality of switching circuits coupled in parallel between an input voltage and a load, and the control method comprises: comparing a feedback signal with a reference signal to generate a comparison signal, wherein the feedback signal is indicative of an output voltage provided to the load; determining the number of switching circuits for power operation based on the load current; detecting a period of the comparison signal; comparing the detected period of the comparison signal with a time threshold to determine whether a transient rise of load current has occurred; and getting all the switching circuits into power operation if a transient rise of load current is detected.

Embodiments of the present invention are also directed to a controller of multi-phase converters, wherein the multi-phase converter includes a plurality of switching circuits coupled in parallel between an input voltage and a load, and the controller comprises: a comparison unit configured to receive a feedback signal indicative of an output voltage provided to the load, wherein the comparison unit compares the feedback signal with a reference signal to generate a comparison signal; an on-time generation unit configured to generate an on-time threshold; a load current comparison unit configured to receive a load current sensing signal indicative of the load current, wherein the load current comparison unit compares the load current sensing signal respectively with a plurality of threshold voltages to generate a plurality of current comparison signals; a period detection unit coupled to the comparison unit and configured to detect a period of the comparison signal; a transient detection unit coupled to the period detection unit, wherein the transient detection unit compares the detected period of the comparison signal with a time threshold to determine whether a transient rise of load current has occurred, and generates a transient detection signal; and a control unit coupled to the comparison unit, on-time generation unit, load current comparison unit and transient detection unit, wherein based on the comparison signal, on-time threshold, the plurality of current comparison signals and the transient detection signal, the control unit generates control signals to control the plurality of switching circuits.

Embodiments of the present invention are further directed to a load transient detection method used in multi-phase converters, wherein the multi-phase converter includes a plurality of switching circuits coupled in parallel between an input voltage and a load, and the load transient detection method comprises: comparing a feedback signal with a reference signal to generate a comparison signal, wherein the feedback signal is indicative of an output voltage provided to the load; detecting a period of the comparison signal; generating a plurality of time thresholds; selecting one of the plurality of time thresholds in accordance with the number of switching circuits currently under power operation; and comparing the selected time threshold with the detected period of the comparison signal to determine whether a load transient has occurred.

In embodiments of the present invention, the period of the comparison signal, which is determined by the feedback signal representing the output voltage, is compared with the time threshold to determine whether a load transient has occurred. This detection method is simple and effective, and can quickly reflect the instantaneous change of load current.

BRIEF DESCRIPTION OF THE DRAWING

The present invention can be further understood with reference to the following detailed description and the appended drawings, wherein like elements are provided with like reference numerals.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
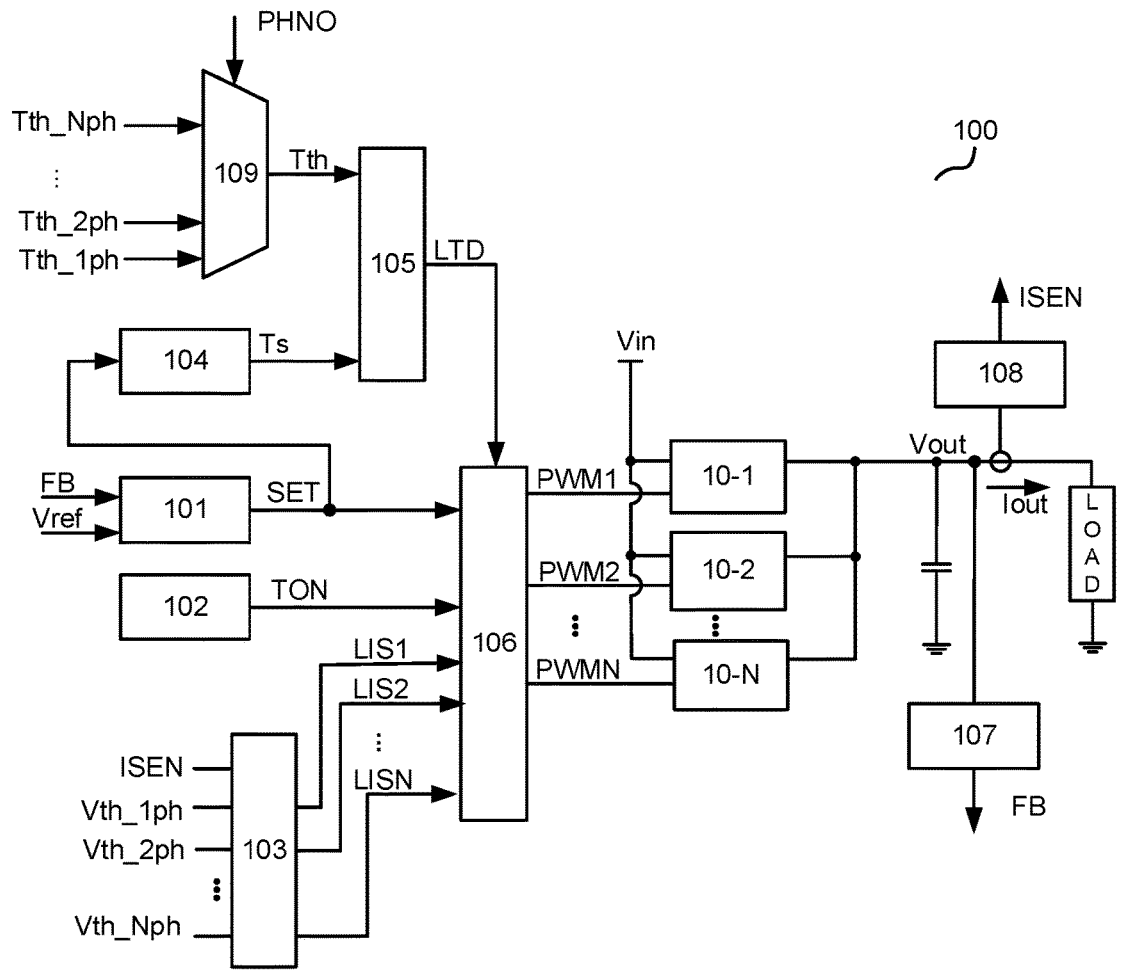
FIG. 1 is a block diagram of a multi-phase converter 100 according to an embodiment of the present invention.

FIG. 1 is a block diagram of a multi-phase switching converter 100 in accordance with an embodiment of the present invention. The switching converter 100 includes a plurality of switching circuits (10-1, 10-2, . . . , 10-N), a comparison unit 101, an on-time generation unit 102, a load current comparison unit 103, a period detection unit 104, a transient detection unit 105, a control unit 106, a feedback unit 107 and a current sensing unit 108. The plurality of switching circuits are coupled in parallel between an input voltage Vin and a load, for converting the input voltage Vin into an output voltage Vout provided to the load. These switching circuits could be configured in same topology, such as BUCK, BOOST, BUCK-BOOST, FLYBACK, FORWARD and so on, and transistors contained therein are typically controllable semiconductor transistors such as MOSFET. The feedback unit 107 is coupled to the load and is configured to generate a feedback signal FB indicative of the output voltage Vout. The current sensing unit 108 is configured to generate a load current sensing signal ISEN indicative of the load current Iout flowing through the load. The comparison unit 101 is coupled to the feedback unit 107. It is configured to receive the feedback signal FB and compare the feedback signal FB with a reference signal Vref to generate a comparison signal SET.

The on-time generation unit 102 is configured to generate an on-time threshold TON, so as to control on-time of the corresponding transistors inside the switching circuits under power operation. The on-time threshold TON could be set as a constant, or a value variable with the input voltage Vin or output voltage Vout.

The load current comparison unit 103 is coupled to the current sensing unit 108 and is configured to receive the load current sensing signal ISEN. The load current comparison unit 103 compares the load current sensing signal ISEN respectively with a plurality of threshold voltages (e.g. Vth_1ph, Vth_2ph, . . . , Vth_Nth) to generate a plurality of current comparison signals (e.g. LIS1, LIS2, . . . , LISN).

The period detection unit 104 is coupled to the comparison unit 101 and configured to detect a period Ts of the comparison signal SET. The transient detection unit 105 is coupled to the period detection unit 104, wherein the transient detection unit 105 compares the detected period Ts with a time threshold Tth to determine whether a transient rise of load current has occurred, and generates a transient detection signal LTD. In an embodiment, a transient rise of load current is detected when the detected period Ts becomes smaller than the time threshold Tth.

The control unit 106 is coupled to the comparison unit 101, on-time generation unit 102, load current comparison unit 103 and transient detection unit 105. Based on the comparison signal SET, on-time threshold TON, current comparison signals LIS1~LISN and the transient detection signal LTD, the control unit 106 generates control signals PWM1~PWMN to respectively control the plurality of switching circuits.

When the multi-phase converter 100 works in a phase-cut mode, the control unit 106 determines the number of switching circuits for power operation based on the current comparison signals LIS1~LISN, so the switching circuits (10-1, 10-2, . . . , 10-N) could only partially enter into power operation according to the load current. If the transient detection signal LTD indicates that a transient rise of load current has occurred, the multi-phase converter 100 will leave the phase-cut mode and get all the switching circuits into power operation.

The comparison signal SET is determined by the feedback signal FB representing the output voltage Vout, and its period Ts is compared with the time threshold Tth to determine whether a load current transient rise has occurred. This detection method is simple, direct and efficient, and can quickly reflect the instantaneous change of load current Iout. So the multi-phase converter 100 could quit the phase-cut mode in time and get all switching circuits into power operation, thus provide sufficient energy to the load.

In one embodiment, the multi-phase converter 100 further includes a multiplexer 109 with a plurality of input terminals and an output terminal, wherein the plurality of input terminals are respectively configured to receive a plurality of time thresholds (Tth_1ph, Tth_2ph, . . . , Tth_Nph), the output terminal is coupled to the transient detection unit 105 to provide the time threshold Tth. In accordance with the number of switching circuits currently under power operation, which is shown as PHNO in FIG. 1, the multiplexer 109 selects one of the plurality of time thresholds and provides the selected time threshold at its output terminal. For instance, Tth_1ph is selected when there is only one switching circuit under power operation, Tth_2ph is selected when there are two switching circuits under power operation, and so on.

Figure 2:
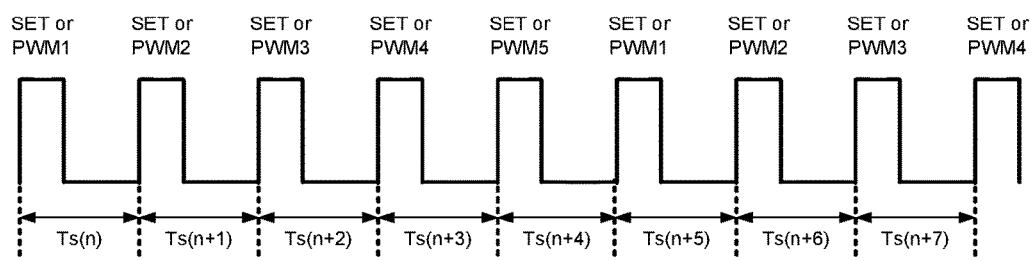
FIGS. 2 and 3 illustrate waveforms of the multi-phase converter 100 with different number of switching circuits under power operation, according to an embodiment of the present invention.
Figure 3:
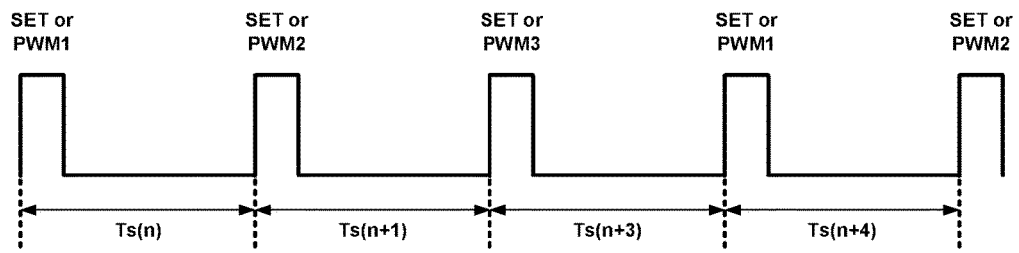

Generally, the switching circuits under power operation interleave with each other. FIGS. 2 and 3 illustrate waveforms of the multi-phase converter 100 with different number of switching circuits under power operation according to an embodiment of the present invention. As shown in the figures, pulses of comparison signal SET will be successively and sequentially provided to the switching circuits under power operation, to turn on the corresponding transistors contained therein. These transistors will be turned off once their on-time reach the on-time threshold TON.

Figure 4:
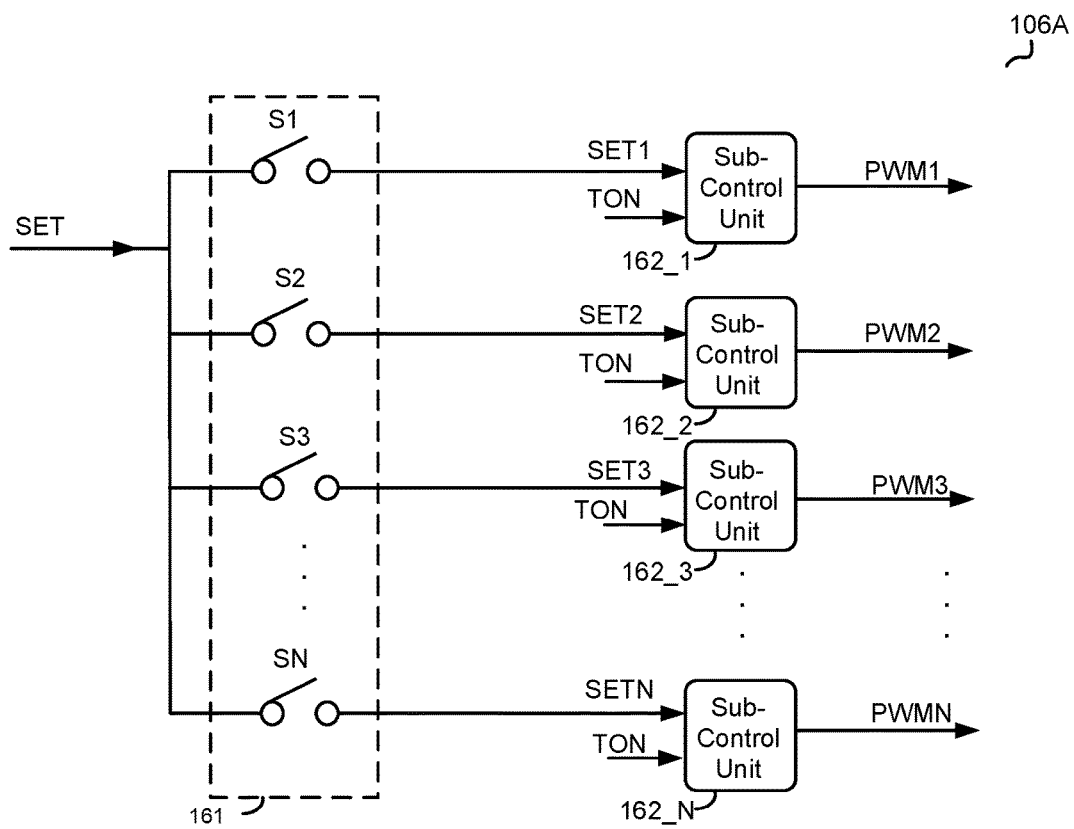
FIG. 4 shows a schematic diagram of a control unit 106A according to an embodiment of the present invention.

FIG. 4 shows a schematic diagram of a control unit 106A according to an embodiment of the present invention. It includes a frequency division unit 161 with switches S1~SN, and sub-control units (162_1, 162_2, . . . , 162_N). The first terminals of the switches S1~SN are connected together to receive the comparison signal SET. Each of the sub-control units 162_i (i=1, 2, . . . , N) has a first input terminal, a second input terminal and an output terminal, wherein the first input terminal is coupled to the second terminal of the corresponding switch to receive the signal SETi, the second input terminal is coupled to the on-time generation unit 102 to receive the on-time threshold TON, and the output terminal is coupled to the corresponding switching circuit to provide a control signal PWMi.

The switching on and off of switches S1~SN are determined by the number and timing sequence of the switching circuits currently under power operation. When a switch Si is turned on, the comparison signal SET is sent into the corresponding sub-control unit 162_i to control the corresponding switching circuit.

Figure 5:
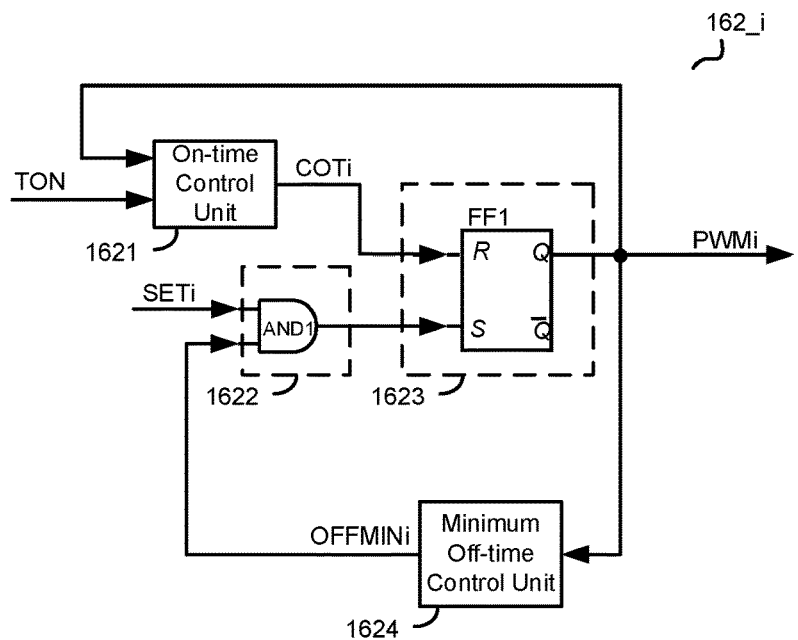
FIG. 5 shows a schematic diagram of a sub-control unit 162_i according to an embodiment of the present invention.

FIG. 5 shows a schematic diagram of a sub-control unit 162_i according to an embodiment of the present invention. It includes an on-time control unit 1621, a gate unit 1622, a logic unit 1623 and a minimum off-time control unit 1624. The on-time control unit 1621 generates an on-time control signal COTi for controlling on-time of the transistor in the corresponding switching circuit, and the minimum off-time control unit 1624 generates a minimum off-time control signal OFFMINi for controlling the minimum off-time of the transistor. The gate unit 1622 is coupled to the frequency division unit 161 and minimum off-time control unit 1624 to receive the signal SETi and the minimum off-time control signal OFFMINi, and is configured to generate a logic output signal based on these two signals. The logic unit 1623 is coupled to the gate unit 1622 and on-time control unit 1621 to receive the logic output signal and the on-time control signal COTi, and is configured to generate a control signal PWMi based thereupon. In one embodiment, the gate unit 1622 is an AND gate and the logic unit 1623 is an RS flip-flop.

Figure 6:
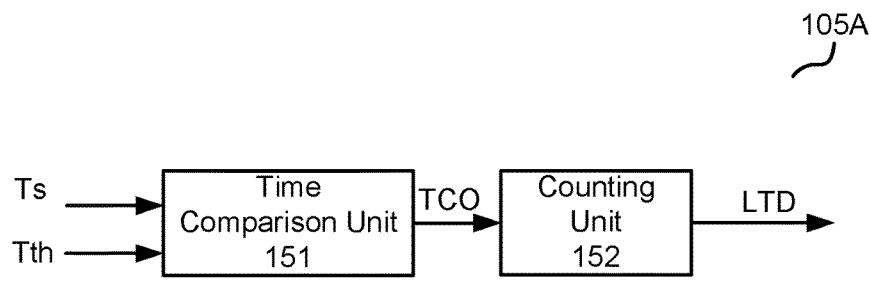
FIG. 6 shows a schematic diagram of a transient detection unit 105A according to an embodiment of the present invention.

FIG. 6 shows a schematic diagram of a transient detection unit 105A according to an embodiment of the present invention, which includes a time comparison unit 151 and a counting unit 152. The time comparison unit 151 is coupled to the period detection unit 104. It compares the detected period Ts with the time threshold Tth during every cycle of the comparison signal SET, and generates a time comparison signal TCO. The counting unit 152 is coupled to the output terminal of the time comparison unit 151, wherein the counting unit 152 counts and generates a counting value based on the time comparison signal TCO, and compares the counting value with a predetermined value to generate the transient detection signal LTD. In one embodiment, if the counting value of the counting unit reaches the predetermined value, which means that Ts is smaller than Tth in multiple successive cycles, the transient detection signal LTD will indicate that a transient rise of load current has occurred.

Figure 7A:
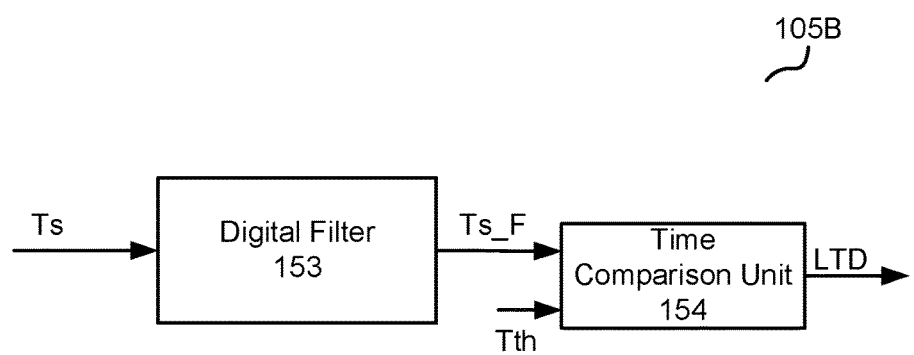
FIG. 7A shows a schematic diagram of a transient detection unit 105B according to an embodiment of the present invention.

FIG. 7A shows a schematic diagram of a transient detection unit 105B according to an embodiment of the present invention, which includes a digital filter 153 and a time comparison unit 154. The digital filter 153 is coupled to the period detection unit 104 to receive the detected period Ts. It is configured to digitally filter Ts and provide a filtered period signal Ts_F. The time comparison unit 154 is coupled to the digital filter 153, and is configured to compare the filtered period signal Ts_F with the time threshold Tth to generate the transient detection signal LTD. In one embodiment, if the filtered period signal Ts_F is smaller than the time threshold Tth, the transient detection signal LTD will indicate that a transient rise of load current has occurred.

Figure 7B:
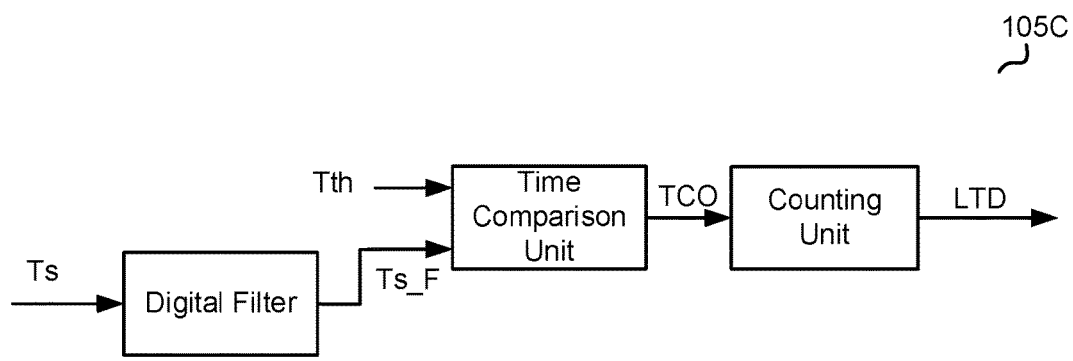
FIG. 7B shows a schematic diagram of a transient detection unit 105C according to an embodiment of the present invention.

The embodiments shown in FIGS. 6 and 7A can effectively reduce the impact of noise on the transient detection unit and ensure the accuracy of detection. In addition, the embodiments shown in FIGS. 6 and 7A could be combined to further enhance the detection accuracy. As shown in FIG. 7B, the detected period Ts could be filtered by the digital filter first, and then the filtered period signal Ts_F is compared with the time threshold Tth through the time comparison unit to generate the time comparison signal TCO. Subsequently, the counting unit is used to count based on the time comparison signal TCO, and the counting value is compared with the predetermined value to produce the transient detection signal LTD.

Figure 8:
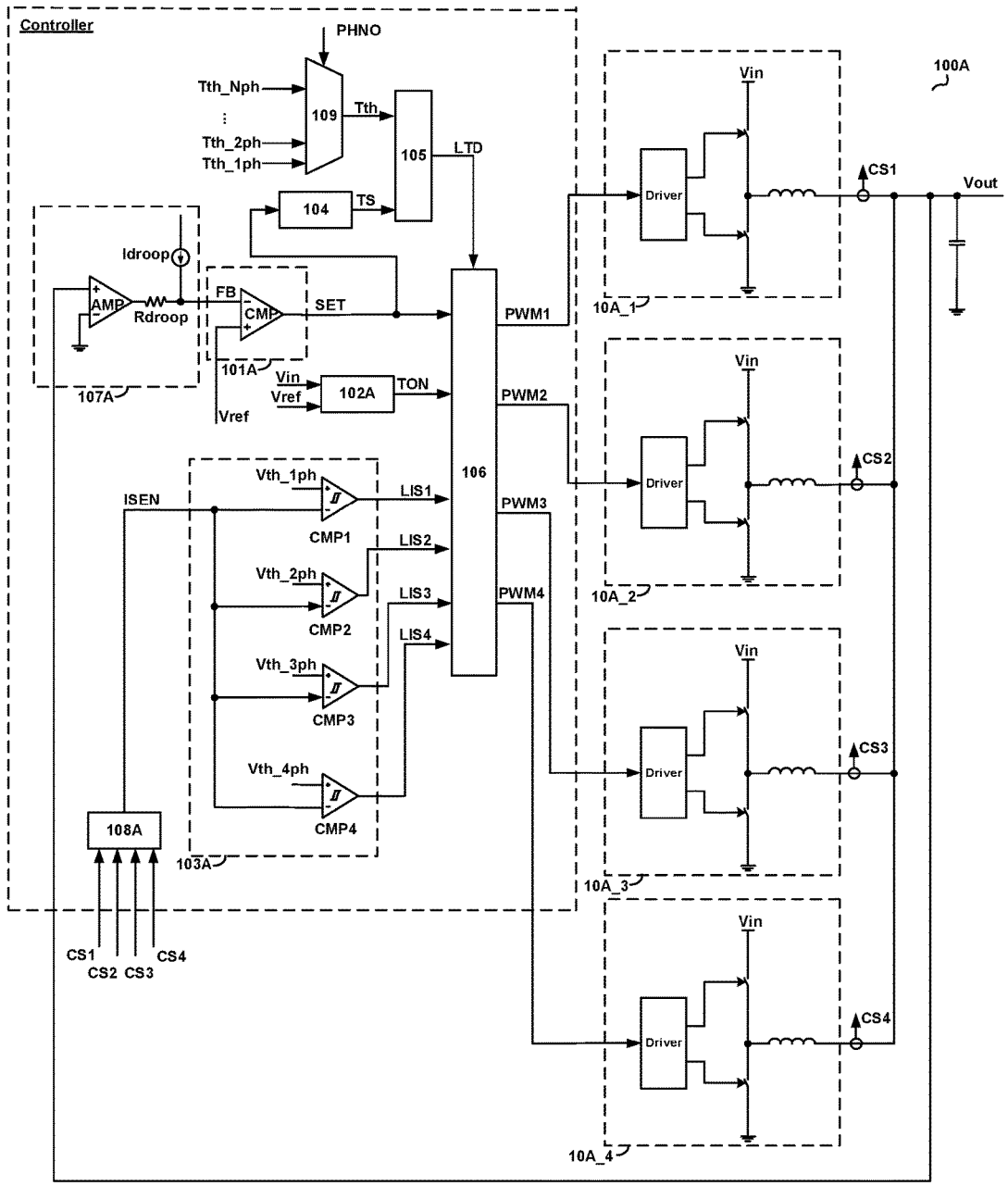
FIG. 8 schematically illustrates a four-phase converter 100A according to an embodiment of the present invention.

FIG. 8 schematically illustrates a four-phase converter 100A according to an embodiment of the present invention. In the embodiments shown in FIG. 8, the switching circuits 10A_1~10A_4 are all configured in synchronous BUCK, and their output currents are respectively sensed to generate output current sensing signals CS1~CS4. The comparison unit 101A, on-time generation unit 102A, load current comparison unit 103A, period detection unit 104, transient detection unit 105, control unit 106, feedback unit 107A, current sensing unit 108A and multiplexer 109 are all formed in the same integrated controller.

The comparison unit 101A includes a comparator CMP. The on-time generator unit 102A produces the on-time threshold TON based on the input voltage Vin and reference signal Vref, which can be expressed as:

$$TON = \frac{Vref}{Vin * fset} \quad (1)$$

Wherein fset represents a preset single-phase switching frequency.

The load current comparison unit 103A includes hysteresis comparators CMP1~CMP4, connected as shown in the figure. The comparators CMP1~CMP4 compare the load current sensing signal ISEN with threshold voltage Vth_1ph, Vth_2ph, Vth_3ph and Vth_4ph, respectively, to determine the number of switching circuits (also called phase number) for power operation in phase-cut mode. The detailed operation principle in phase-cut mode is shown in the table below, wherein VHYS is a hysteresis voltage, CCM represents a current continuous mode and DCM represents a current discontinuous mode.

| Condition | Power Operation Phase Number |
| --- | --- |
| ISEN > Vth_4ph + VHYS | 4-phase CCM |
| Vth_3ph + VHYS < ISEN ≤ Vth_4ph | 3-phase CCM |
| Vth_2ph + VHYS < ISEN ≤ Vth_3ph | 2-phase CCM |
| Vth_1ph + VHYS < ISEN ≤ Vth_2ph | 1-phase CCM |
| ISEN < Vth_1ph | 1-phase DCM |

The current sensing unit 108A generates the load current sensing signal ISEN indicative of the load current based on the output current sensing signals CS1-CS4. The load current sensing signal ISEN could be gained through summing, filtering and scaling up/down the output current sensing signals CS1-CS4. The feedback unit 107A includes a differential amplifier AMP, a resistor Rdroop and a current source Idroop. The two input terminals of differential amplifier AMP are coupled across the load. One end of the resistor Rdroop is coupled to the output terminal of differential amplifier AMP, while the other end is coupled to the current source Idroop and provides the feedback signal FB. The current generated by the current source Idroop is proportional to the load current.

It should be noted that, although the switching circuit in the embodiment shown in FIG. 8 is configured in synchronous BUCK, this is not used to limit the invention, and other suitable DC-DC converter topologies are also applicable.

Figure 9:
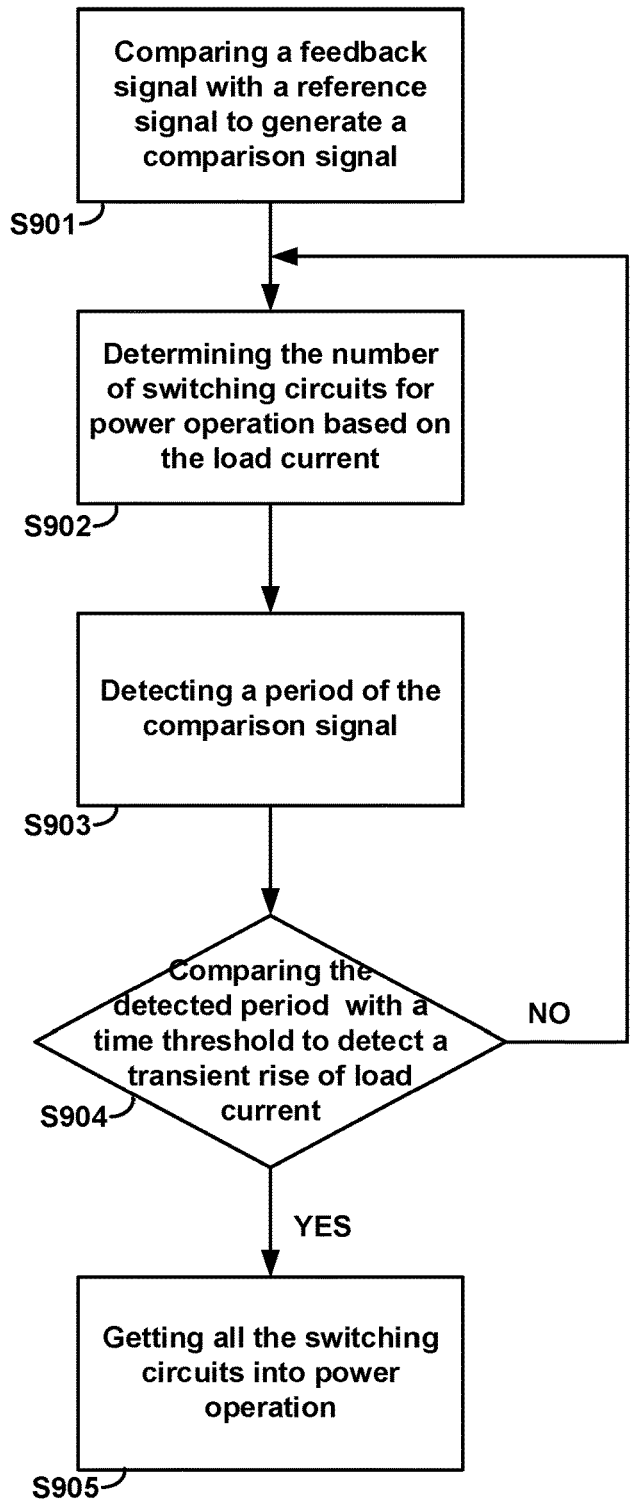
FIG. 9 is a flowchart of a control method used in multi-phase converters according to an embodiment of the present invention.

FIG. 9 is a flowchart of a control method used in multiphase converters with a plurality of parallel-connected switching circuits, in accordance with an embodiment of the present invention. It includes steps S901~S905.

At step S901, a feedback signal, which is indicative of an output voltage provided to the load, is compared with a reference signal to generate a comparison signal.

At step S902, the number of switching circuits for power operation is determined based on the load current. When the load current is small, there could be only part of the plurality of switching circuits entering into power operation, while the rest cease working and do not supply power to the load.

At step S903, a period of the comparison signal is detected.

At step S904, the detected period of the comparison signal is compared with a time threshold to determine whether a transient rise of load current has occurred. If a transient rise of load current has been detected, the step S905 will be performed. Otherwise, the process will go back to the step S902.

At step S905, all the switching circuits are forced into power operation.

In an embodiment, the step S904 includes: generating a plurality of time thresholds; selecting one of the plurality of time thresholds in accordance with the number of switching circuits currently under power operation; and comparing the selected time threshold with the detected period of the comparison signal.

In some embodiments, the step S904 further includes: comparing the detected period of the comparison signal with the time threshold to generate a time comparison signal; counting based on the time comparison signal and generating a counting value; comparing the counting value with a predetermine value; and determining a transient rise of load current has occurred if the counting value reaches the predetermined value.

In some other embodiments, the step S904 includes: digitally filtering the detected period of the comparison signal to generate a filtered period signal; comparing the filtered period signal with the time threshold; and determining a transient rise of load current has occurred if the filtered period signal is smaller than the time threshold.

In embodiments discussed above, the period of comparison signal is compared with the time threshold to determine whether a load current transient rise has occurred. It could be understood by people of ordinary skill in the art, however, that this scheme could also be utilized to determine whether a load current transient decline has occurred, without departing from the spirit of the invention.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A control method of multi-phase converters, wherein the multi-phase converter includes a plurality of switching circuits coupled in parallel between an input voltage and a load, and the control method comprises: comparing a feedback signal with a reference signal to generate a comparison signal, wherein the feedback signal is indicative of an output voltage provided to the load; determining a number of switching circuits for power operation based on a load current; detecting a period of the comparison signal; comparing the detected period of the comparison signal with a time threshold to determine whether a transient rise of load current has occurred; and getting all the plurality of switching circuits into power operation if the transient rise of load current is detected.

2. The control method of claim 1, wherein determining whether the transient rise of load current has occurred includes: generating a plurality of time thresholds; selecting one of the plurality of time thresholds in accordance with the number of switching circuits currently under power operation; and comparing the selected time threshold with the detected period of the comparison signal.

3. The control method of claim 1, wherein determining whether the transient rise of load current has occurred includes: comparing the detected period of the comparison signal with the time threshold to generate a time comparison signal; counting based on the time comparison signal and generating a counting value; comparing the counting value with a predetermine value; and determining the transient rise of load current has occurred if the counting value reaches the predetermined value.

4. The control method of claim 1, wherein determining whether the transient rise of load current has occurred includes: digitally filtering the detected period of the comparison signal to generate a filtered period signal; comparing the filtered period signal with the time threshold; and determining the transient rise of load current has occurred if the filtered period signal is smaller than the time threshold.

5. The control method of claim 1, wherein determining the number of switching circuits for power operation includes: respectively sensing an output current of the plurality of switching circuits to generate a plurality of output current sensing signals; generating a load current sensing signal indicative of the load current based on the plurality of output current sensing signals; and comparing the load current sensing signal respectively with a plurality of current threshold signals, and determining the number of switching circuits for power operation in accordance with a comparison results.

6. The control method of claim 1, further comprising: generating an on-time threshold; and generating control signals based on the comparison signal and on-time threshold, to control the number of switching circuits currently under power operation.

7. A controller of multi-phase converters, wherein the multi-phase converter includes a plurality of switching circuits coupled in parallel between an input voltage and a load, and the controller comprises: a comparison unit configured to receive a feedback signal indicative of an output voltage provided to the load, wherein the comparison unit compares the feedback signal with a reference signal to generate a comparison signal; an on-time generation unit configured to generate an on-time threshold; a load current comparison unit configured to receive a load current sensing signal indicative of a load current, wherein the load current comparison unit compares the load current sensing signal respectively with a plurality of threshold voltages to generate a plurality of current comparison signals; a period detection unit coupled to the comparison unit and configured to detect a period of the comparison signal; a transient detection unit coupled to the period detection unit, wherein the transient detection unit compares the detected period of the comparison signal with a time threshold to determine whether a transient rise of load current has occurred, and generates a transient detection signal; and a control unit coupled to the comparison unit, on-time generation unit, load current comparison unit and transient detection unit, wherein based on the comparison signal, on-time threshold, the plurality of current comparison signals and the transient detection signal, the control unit generates control signals to control the plurality of switching circuits.

8. The controller of multi-phase converters of claim 7, wherein: when the multi-phase converter works in a phase-cut mode, the control unit determines a number of switching circuits for power operation based on the plurality of current comparison signals, so the plurality of switching circuits could only partially enter into power operation according to the load current; and if the transient detection signal indicates that the transient rise of load current has occurred, the multi-phase converter will leave the phase-cut mode and get all the plurality of switching circuits into power operation.

9. The controller of multi-phase converters of claim 7, further comprising: a multiplexer having a plurality of input terminals and an output terminal, wherein the plurality of input terminals are respectively configured to receive a plurality of time thresholds, the output terminal is coupled to the transient detection unit, and wherein in accordance with a number of switching circuits currently under power operation, the multiplexer selects one of the plurality of time thresholds and provides the selected time threshold at the output terminal.

10. The controller of multi-phase converters of claim 9, wherein the transient detection circuit includes: a time comparison unit having a first input terminal, a second input terminal and an output terminal, wherein the first input terminal is coupled to the period detection unit to receive the detected period of the comparison signal, the second input terminal is coupled to the output terminal of the multiplexer, and wherein the time comparison unit compares the detected period of the comparison signal with the time threshold selected by the multiplexer, and generates a time comparison signal; and a counting unit coupled to the output terminal of the time comparison unit, wherein the counting unit counts and generates a counting value based on the time comparison signal, and compares the counting value with a predetermined value to generate the transient detection signal.

11. The controller of multi-phase converters, wherein the transient detection unit includes: a digital filter having an input terminal and an output terminal, wherein the input terminal is configured to receive the detected period of the comparison signal, and the output terminal is configured to provide a filtered period signal; and a time comparison unit having a first input terminal, a second input terminal and an output terminal, wherein the first input terminal is coupled to the digital filter to receive the filtered period signal, the second input terminal is coupled to the output terminal of the multiplexer, wherein the time comparison unit compares the filtered period signal with the time threshold selected by the multiplexer, and generates the transient detection signal.

12. A load transient detection method used in multi-phase converters, wherein the multi-phase converter includes a plurality of switching circuits coupled in parallel between an input voltage and a load, and the load transient detection method comprises: comparing a feedback signal with a reference signal to generate a comparison signal, wherein the feedback signal is indicative of an output voltage provided to the load; detecting a period of the comparison signal; generating a plurality of time thresholds; selecting one of the plurality of time thresholds in accordance with a number of switching circuits currently under power operation; and comparing the selected time threshold with the detected period of the comparison signal to determine whether a load transient has occurred.

13. The load transient detection method of claim 12, wherein the step of determining whether the load transient has occurred includes: comparing the detected period of the comparison signal with the selected time threshold to generate a time comparison signal; counting based on the time comparison signal and generating a counting value; comparing the counting value with a predetermine value; and determining the load transient has occurred if the counting value reaches the predetermined value.

14. The load transient detection method of claim 12, wherein the step of determining whether the load transient has occurred includes: digitally filtering the detected period of the comparison signal to generate a filtered period signal; and comparing the filtered period signal with the selected time threshold to determine whether the load transient has occurred.

15. The load transient detection method of claim 12, wherein the step of determining whether the load transient has occurred includes: digitally filtering the detected period of the comparison signal to generate a filtered period signal; comparing the filtered period signal with the selected time threshold to generate a time comparison signal; counting based on the time comparison signal and generating a counting value; comparing the counting value with a predetermine value; and determining the load transient has occurred if the counting value reaches the predetermined value.

* * * * *